(12) United States Patent
Zhou et al.

(10) Patent No.: US 9,716,336 B2
(45) Date of Patent: Jul. 25, 2017

(54) CAGE OF ELECTRONIC APPARATUS

(71) Applicant: Tyco Electronics (Shanghai) Co. Ltd., Shanghai (CN)

(72) Inventors: Jian Zhou, Shanghai (CN); Hongwen Yang, Shanghai (CN); Xinbo Liu, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 37 days.

(21) Appl. No.: 14/717,424

(22) Filed: May 20, 2015

(65) Prior Publication Data

US 2015/0340797 A1    Nov. 26, 2015

(30) Foreign Application Priority Data

May 20, 2014    (CN) ..................... 2014 2 0258489 U

(51) Int. Cl.

| | |
|---|---|
| *H01R 13/648* | (2006.01) |
| *H01R 13/516* | (2006.01) |
| *H01R 13/6594* | (2011.01) |
| *H01R 13/658* | (2011.01) |
| *H05K 9/00* | (2006.01) |
| *H01R 13/518* | (2006.01) |
| *H01R 13/506* | (2006.01) |

(52) U.S. Cl.
CPC ......... *H01R 13/516* (2013.01); *H01R 13/518* (2013.01); *H01R 13/658* (2013.01); *H01R 13/6594* (2013.01); *H05K 9/0058* (2013.01); *H01R 13/506* (2013.01)

(58) Field of Classification Search
CPC   H01R 13/648; H01R 13/658; H01R 13/6494; H01R 13/6495; H01R 13/518; H01R 13/516
USPC ... 439/607.2, 607.21, 607.23, 607.35, 607.4, 439/607.54, 607.55
See application file for complete search history.

(56) References Cited

U.S. PATENT DOCUMENTS

| | | | |
|---|---|---|---|
| 6,729,905 B1 * | 5/2004 | Hwang ............ | H01R 13/65802 439/607.21 |
| 7,357,673 B2 * | 4/2008 | Long ................... | H01R 12/716 439/607.05 |
| 8,182,290 B2 * | 5/2012 | Fonteneau .......... | H05K 9/0058 439/607.21 |
| 2015/0303622 A1 * | 10/2015 | Tao .................... | H01R 13/6581 439/607.55 |

\* cited by examiner

*Primary Examiner* — Felix O Figueroa
(74) *Attorney, Agent, or Firm* — Barley Snyder

(57) ABSTRACT

An insulating housing for receiving an electronic apparatus has an upper housing, a lower housing connected to the upper housing, and a device receiving space positioned between the upper housing and the lower housing. Two upper sidewalls are positioned on opposite edges of the upper housing. Two lower sidewalls are positioned on opposite edges of the lower housing, each of the lower sidewalls being connected with one of the upper sidewalls. Each lower sidewall has a first lower sidewall, and a second lower sidewall independent from the first lower sidewall that is positioned proximate to a device receiving end of the insulating housing.

12 Claims, 8 Drawing Sheets

CAGE OF ELECTRONIC APPARATUS

CROSS-REFERENCE TO RELATED APPLICATIONS

This application claims the benefit of the filing date under 35 U.S.C. §119(a)-(d) of Chinese Patent Application No. 201420258489.8 filed May 20, 2014.

FIELD OF THE INVENTION

The invention is generally related to an electronic device receiving housing, and, more specifically, related to an electronic device receiving housing that is self-supporting.

BACKGROUND

Conventionally, an electronic apparatus, such as an electrical connector, a fiber optic connector, a photoelectric converter and the like, generally has an insulating housing for receiving an electronic device therein. The housing provides electromagnetic shielding protection for the inserted electronic device.

A conventional two-component insulating housing 200 is shown in FIG. 1, having an upper housing 202 connected to a lower housing 203. FIG. 2 shows a perspective view of the upper housing 202 and FIG. 3 shows a perspective view of the lower housing 203. An inner receiving space is positioned between the upper housing 202 and the lower housing 203. The inner receiving space is separated into a plurality of substantially rectangular device receiving spaces 201 by a plurality of partition walls 204. Two opposite upper sidewalls 2021 are bent downwards from the upper housing 202, each upper sidewall 2021 having protrusions 2022 thereon. Two opposite lower sidewalls 2031 are bent upwards from the lower housing 203, each lower sidewall 2031 having corresponding protrusion receiving notches 2032 that are complimentary in shape to the protrusions 2022. When the upper housing 202 and the lower housing 203 are joined together, an inner surface of the lower sidewall 2031 abuts against an outer surface of the upper sidewall 2021, and the protrusion 2022 is engaged into the protrusion receiving notch 2032, so as to hold the upper housing 202 and the lower housing 203 together. At the same time, pins 2022 extending from the upper sidewall 2021 pass through pin receiving holes (not labeled) positioned in the lower sidewall 2031. The pins 2022 protrude through the pin receiving holes and out of the lower housing 203, so as to mount the entire housing 200 on a circuit board (not shown).

As shown in FIG. 1, in the housing 200, there is not provided any joining structure between a front end 2023 of the upper sidewall 202 and the lower housing. As a result, the housing 200 is structurally weak at a matching portion between the upper housing 202 and the lower housing 203 at mating ends thereof and is prone to deformation, such as port cracking, port dislocation or the like. Once the housing 200 becomes deformed, the electromagnetic shielding protection of an inserted connector suffers, and is decreased.

SUMMARY

An insulating housing for receiving an electronic apparatus has an upper housing, a lower housing connected to the upper housing, and a device receiving space positioned between the upper housing and the lower housing. Two upper sidewalls are positioned on opposite edges of the upper housing. Two lower sidewalls are positioned on opposite edges of the lower housing, each of the lower sidewalls being connected with one of the upper sidewalls. Each lower sidewall has a first lower sidewall, and a second lower sidewall independent from the first lower sidewall that is positioned proximate to a device receiving end of the insulating housing.

BRIEF DESCRIPTION OF THE DRAWINGS

The invention will now be described by way of example, with reference to the accompanying Figures, of which.

DETAILED DESCRIPTION OF THE EMBODIMENT(S)

Figure 1:
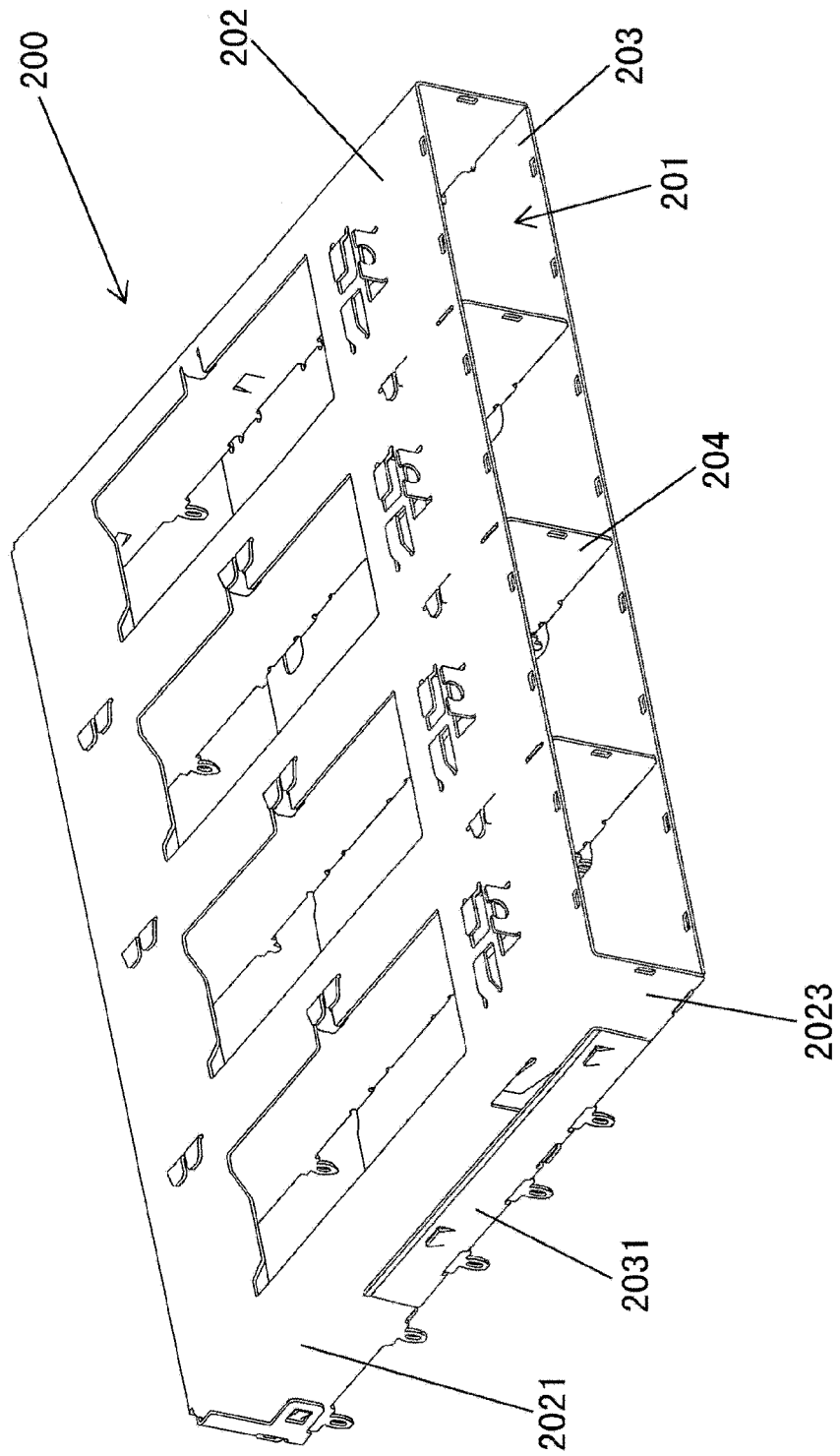
FIG. 1 is a perspective view of a housing of conventional insulating housing.
Figure 2:
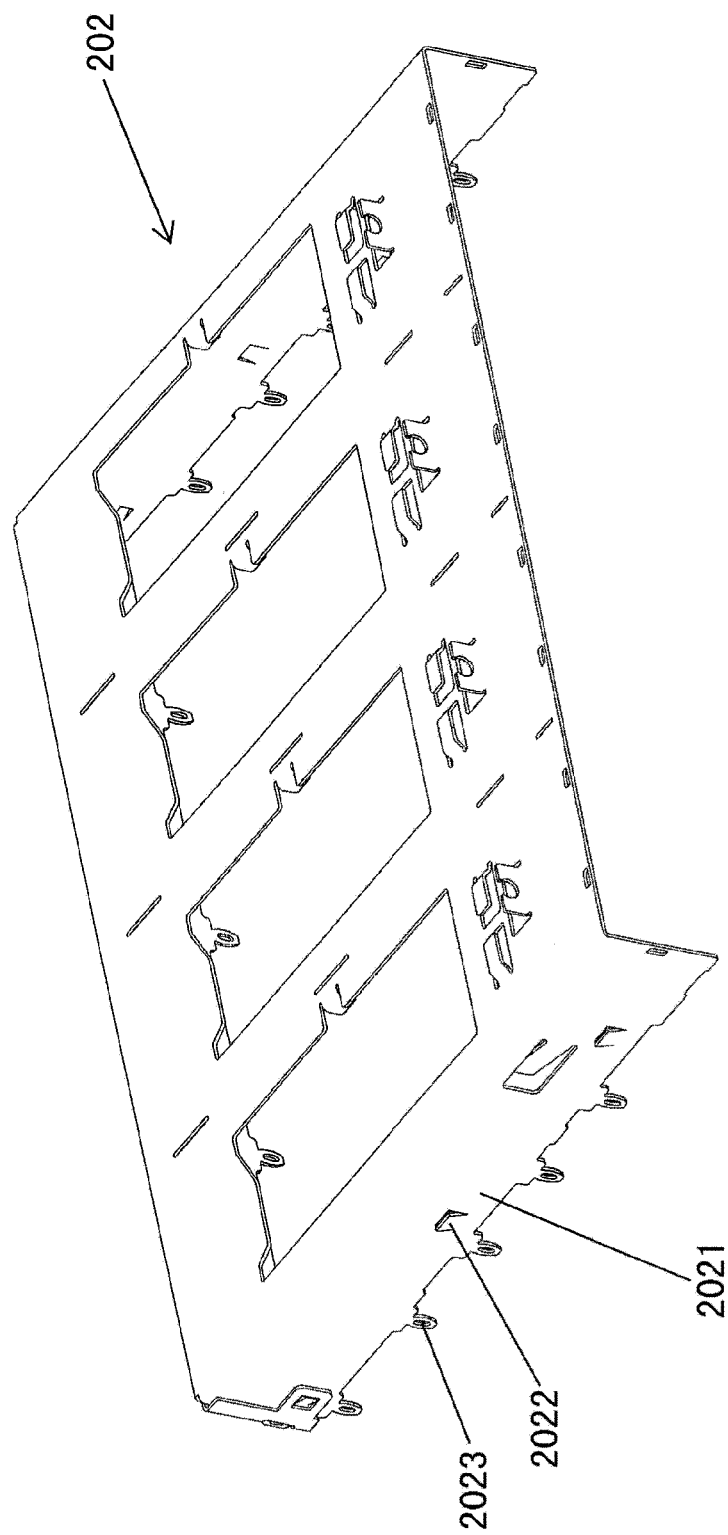
FIG. 2 is a perspective view of a conventional upper housing.
Figure 3:
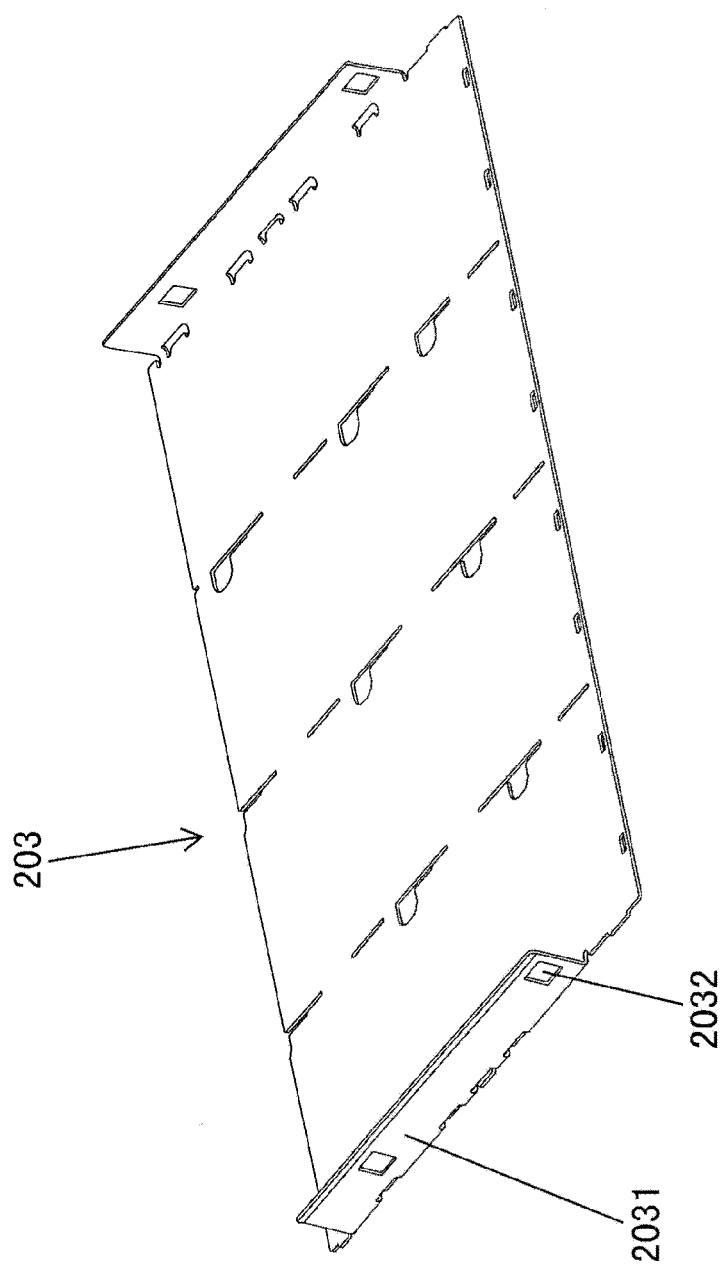
FIG. 3 is a perspective view of a conventional lower housing.

Exemplary embodiments of the following invention will be described hereinafter in detail with reference to the attached drawings, wherein the like reference numerals refer to the like elements. The invention may, be embodied in many different forms and should not be construed as being limited to the embodiment set forth herein. Rather, these embodiments are provided so that the disclosure of the invention will be thorough and complete, and will fully convey the concept of the invention to those skilled in the art.

In the following detailed description, for purposes of explanation, numerous specific details are set forth in order to provide a thorough understanding of the disclosed embodiments. It will be apparent to those skilled in the art, however, that one or more embodiments may be practiced without these specific details. In some embodiments, well-known structures and devices are schematically shown in order to simplify the drawing.

Figure 4:
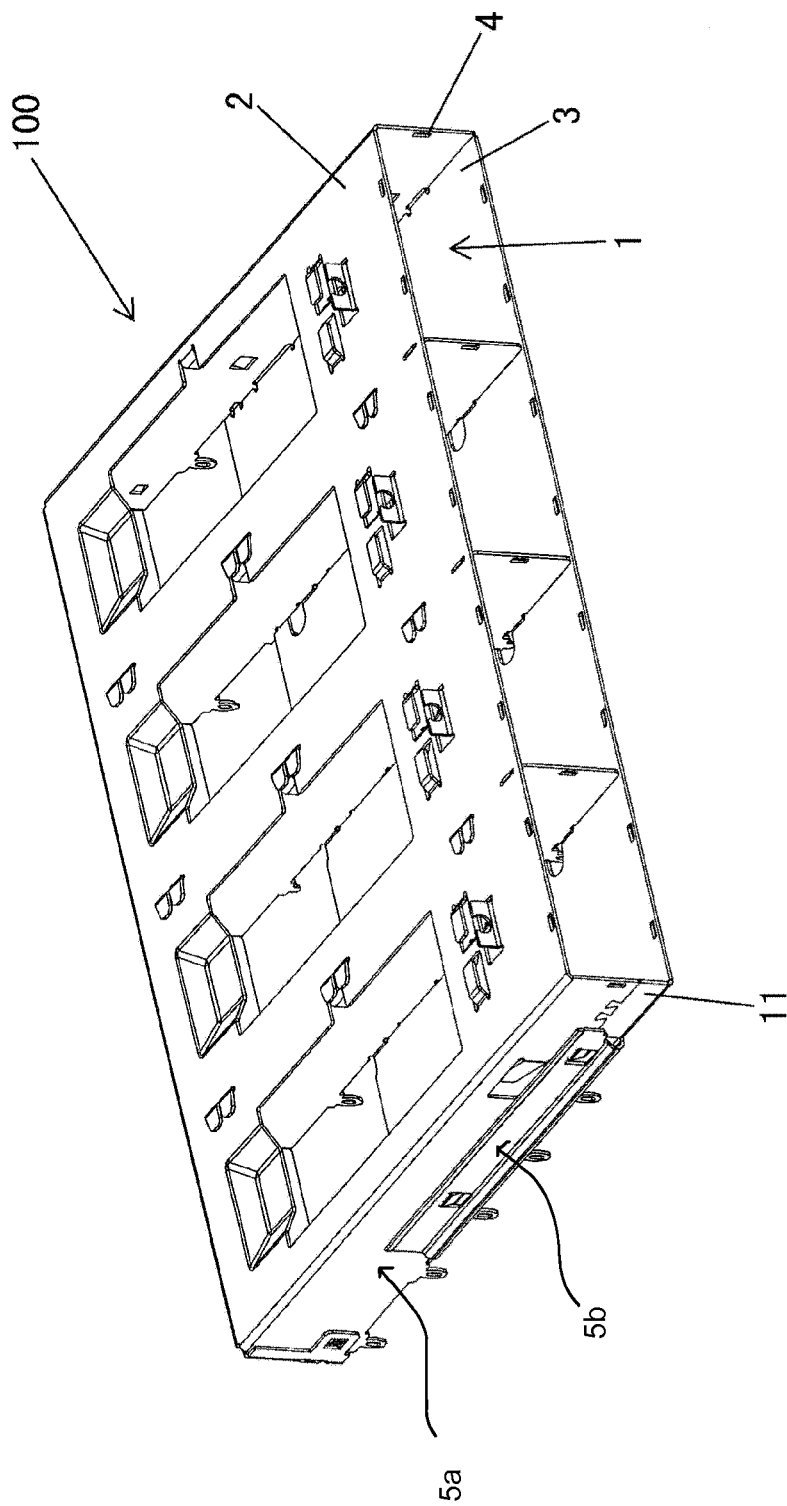
FIG. 4 is a perspective view of a mating end of an insulating housing having an upper housing and a lower housing.
Figure 5:
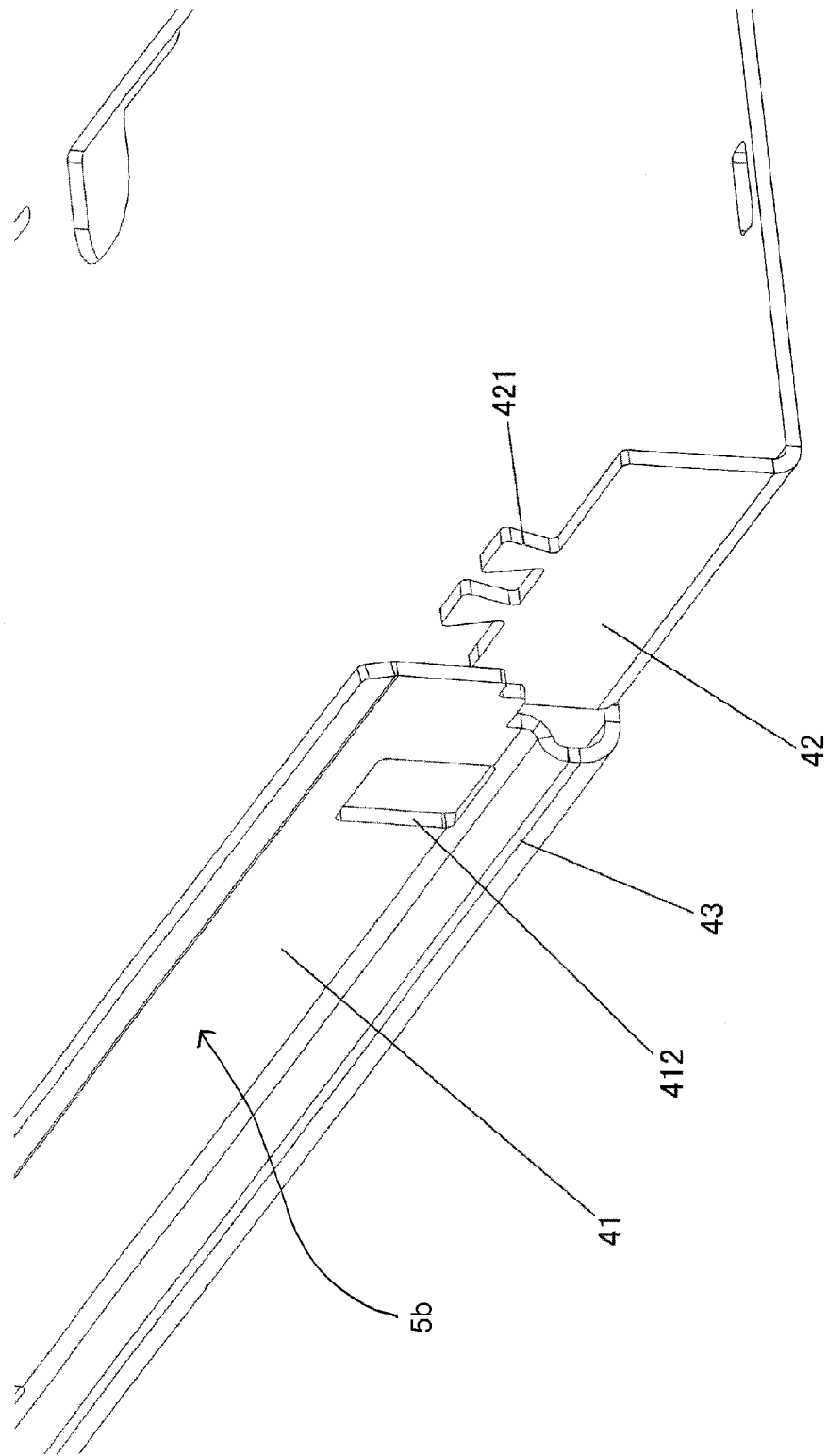
FIG. 5 is an enlarged perspective view of the a lower housing and a lower sidewall of the lower housing in FIG. 4.
Figure 6:
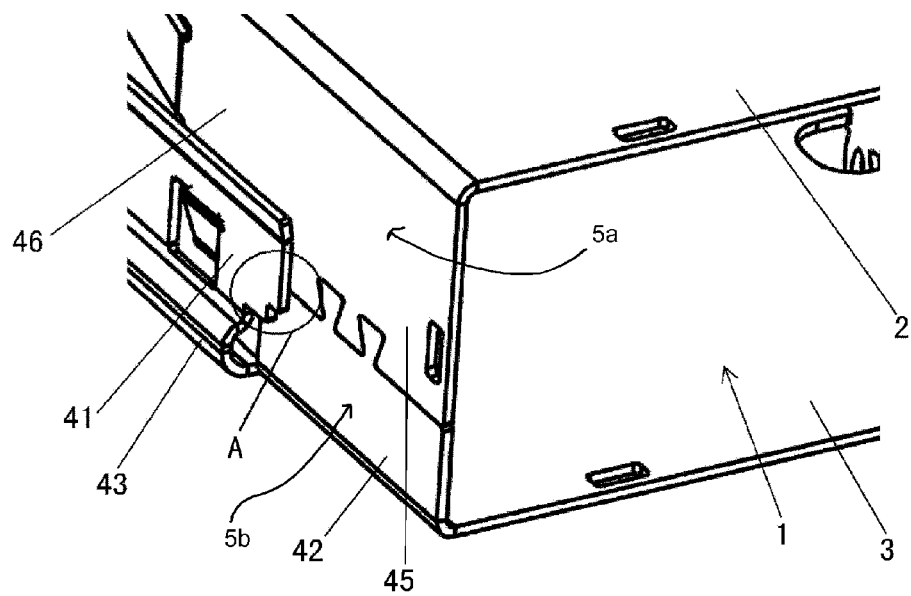
FIG. 6 is an enlarged view of the upper housing connected to the lower housing.

Referring to the embodiments shown in FIGS. 4-6, an insulating housing 100 is made of a piece of metal sheet, such as copper or stainless steel. The housing 100 comprises one or more substantially rectangular device receiving spaces 1 for receiving an electronic device (not shown), each device receiving space 1 is defined by an upper housing 2, a lower housing 3 and two opposite sidewalls 4. Each of two opposite sidewalls 4 have an upper sidewall 5a vertically extending from the upper housing 2 and a lower sidewall 5b vertically extending from the lower housing 3. The lower sidewall 5b connects with the upper sidewall 5a and comprises a first lower sidewall 41 and a second lower sidewall 42 independent of (separated from) the first lower sidewall 41. The second lower sidewall 42 is positioned proximate to a device receiving end of the insulating housing 100. A portion of the first lower sidewall 41 extends towards the second lower sidewall 42, having an inner surface (not labeled) that abuts against an outer surface of the second lower sidewall 42.

Since a portion of the first lower sidewall 41 extends to and abuts against the outer surface of the second lower sidewall 42, a self-holding region is formed at a contact location between the first lower sidewall 41 and the second lower sidewall 42. In this way, during inserting an electronic device, for example, an electrical connector or the like, into the device receiving space 1 of the housing 100 or during other operations, the first lower sidewall 41 abuts against the outside of the second lower sidewall 42, and the second lower sidewall 42 is supported by the first lower sidewall 41, preventing the second lower sidewall 42 from being laterally deformed, keeping the shape of the insulating housing 100 at the port thereof, and increasing the lateral strength of the insulating housing 100.

In another embodiment, as shown in FIGS. 5-6, a bent transition portion 43 protruding outward is positioned between the lower housing 3 and the first lower sidewall 41, increasing the force to hold the second lower sidewall 42 inward from the first lower sidewall 41.

Figure 8:
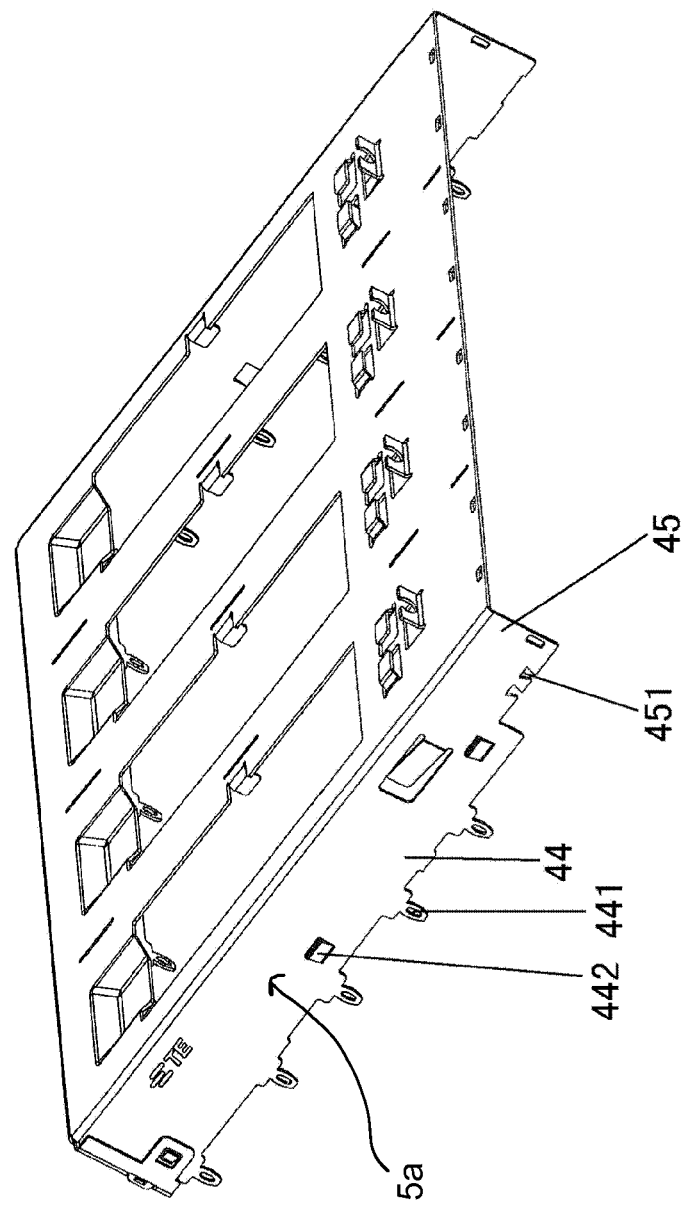
FIG. 8 is a perspective view of an upper housing and an upper sidewall of the upper housing in FIG. 4.

In an embodiment shown in FIGS. 4 and 8, the upper sidewall 5a comprises a first upper sidewall 44, and a second upper sidewall 45 integrally connected with the first upper sidewall 44. The inner surface of the first lower sidewall 41 abuts against an outer surface of the first upper sidewall 44. In this way, as shown in a portion A of FIG. 6, a second self-holding region is formed at a contact location between the first and second lower sidewalls 41, 42 and the first upper sidewall 44, further increasing the strength of the insulating housing 100.

Generally, a gasket (not shown), made of, for example, conductive rubber, is positioned at a port on the device receiving end of each device receiving space 1 of the insulating housing 100, so as to shield the inserted electronic device from the insulating housing 100 near the gasket. Since the insulating housing 100 has a lowered deformation risk due to the configuration of the upper sidewall 5a and lower sidewall 5b, the risk of the port being deformed is correspondingly decreased, as well as the risk of the gasket being scratched.

In the embodiments shown in FIGS. 4 and 8, a plurality of pins 441 are positioned on the first upper sidewall 44, and a portion of the pins 441 pass through complimentary pin receiving holes (not labeled) positioned in the lower housing 3 at an inner side of the first lower sidewall 41. The pins 441 protrude out of the lower housing 3, so as to mount the entire housing 100 on a circuit board (not shown).

In the embodiments shown in FIGS. 5 and 8, the second lower sidewall 42 and the second upper sidewall 45 are connected by a complementary connecting mechanism. In an embodiment, the connecting mechanism includes a dovetail groove 451 (shown in FIG. 8) disposed in the second upper sidewall 45, and a corresponding dovetail protrusion 421 (shown in FIG. 5), mating with the dovetail groove 451, positioned on the second lower sidewall 42. When the upper sidewall 5a and the lower sidewall 5b are joined together, the dovetail protrusion 421 is inserted into the dovetail groove 451, preventing the upper sidewall 5a from being separated from the lower sidewall 5b in an upper-down direction, further increasing the strength of the housing.

In an embodiment, the above self-holding configuration off the upper sidewall 5a and the lower sidewall 5b provides a lateral holding force. The dovetail groove connecting mechanism may provide a holding force in a longitudinal direction of the housing. In this way, the dovetail groove configuration and the self-holding configuration cooperate with each other to greatly increase the strength of the port of the insulating housing 100.

In another embodiment, a projection receiving opening 412 is disposed in the first lower sidewall 41, a locking projection 442 complimentary with the projection receiving opening 412 is disposed on the first upper sidewall 44. The locking projection 442 is engaged with the projection receiving opening 412 to prevent the upper sidewall 5a from being separated from the lower sidewall 5b. In an alternative embodiment, the projection receiving opening is formed in the first upper sidewall, and the protrusion matching with the projection receiving opening is formed on the first lower sidewall 5b.

Figure 9:
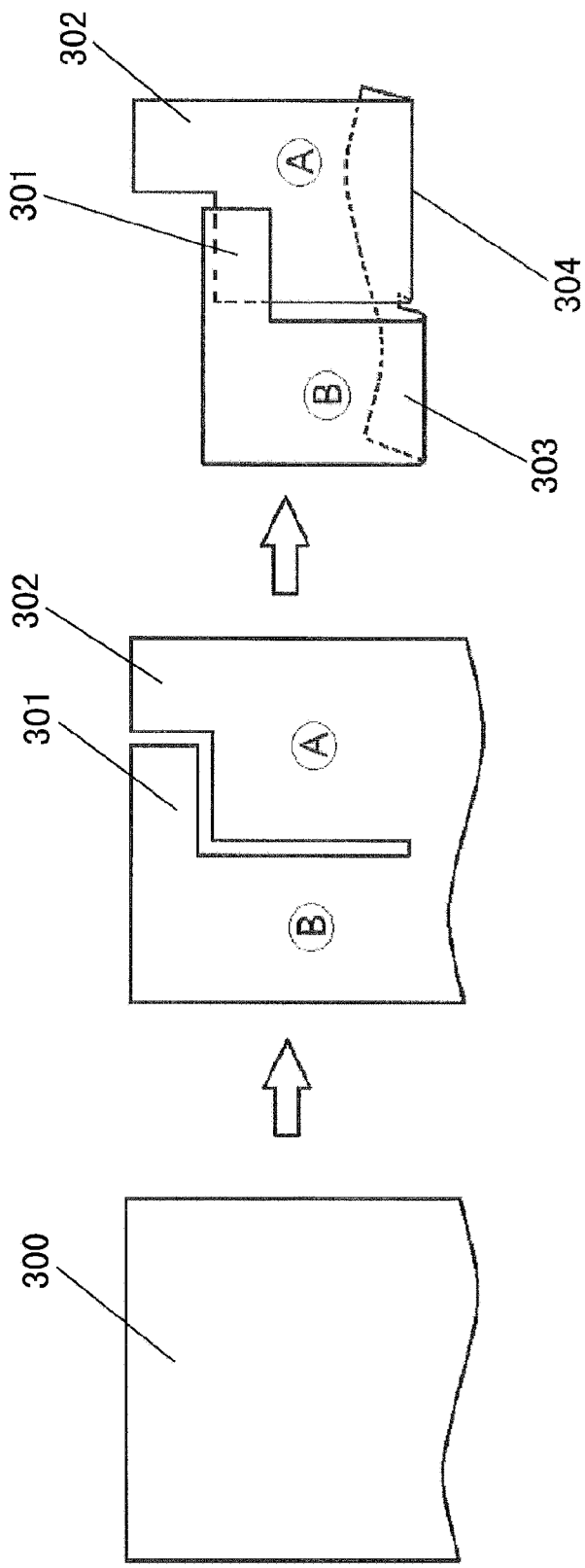
FIG. 9 is a schematic diagram of processing the self-holding lower sidewall.

Processing of the self-holding lower sidewall 5b is shown in an embodiment of FIG. 9. Firstly, a metal sheet 300 is cut into two sections A and B with an extension portion 301 and a protrusion portion 302. Secondly, section A is bent approximately vertically, and section B is bent at a position outside of a base 304 of the section A to form a bent portion protruding outward at a base 303 of the section B. An inner surface of the extension portion 301 abuts against an outer surface of the section A, and the protrusion portion 302 has a greater length than the extension portion 301 such that the protrusion portion 302 is higher than the extension portion 301. As a result, a self-holding region is formed at a contact location between the extension portion 301 and the section A, and the extension portion 301 may exert a certain force moment on the section A to prevent the section A from being deformed outward.

Figure 7:
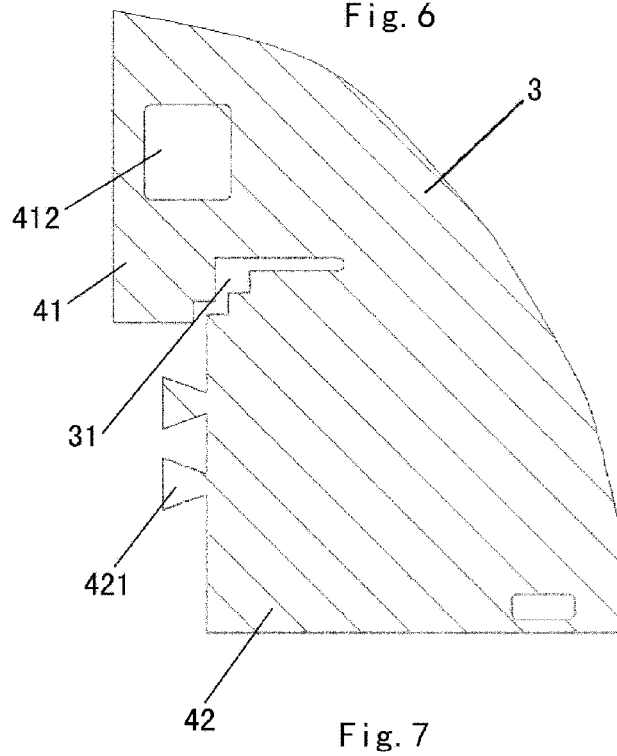
FIG. 7 is a plan view of a portion of a metal sheet for making the lower housing and the lower sidewall, prior to bending.

Based on the principle shown in FIG. 9, the metal sheet may be cut to have a shape shown in FIG. 7. Firstly, the second lower sidewall 42 is bent approximately vertically. Then the first lower sidewall 41 is bent at outside of a base of the second lower sidewall 42 to form a bended transition portion protruding outward at a base of the first lower sidewall 41, so that an inner surface of a portion of the first lower sidewall 41 abuts against an outer surface of the second lower sidewall 42.

Those of ordinary skill in the art would appreciate that in other embodiments only one of the two outmost sidewalls has a configuration with an upper sidewall 5a separable from a lower sidewall 5b, and the other of the two outmost sidewalls is integrally formed. In an alternative embodiment, each of the two outmost sidewalls may have a configuration with an upper sidewall 5a separable from a lower sidewall 5b, that is, the housing may comprise an upper section and a lower section separable from each other as shown in FIGS. 5 and 8.

Those of ordinary skill in this art would appreciate that the insulating housing is not limited to an insulating housing of an electrical connector. In an alternative embodiment, the housing may be a housing of any electronic apparatus, such as CPU, photoelectric converter, switching circuit, charge interface or the like. The insulating housing is not only used to provide an electromagnetic shielding function for the electronic device in the housing, but also provide a support for the electronic device. For example, it may be used to guide the insertion of a body of a connector and fix a heat sink.

In the insulating housing 100, since a self-holding region is formed at a contact location between the first lower sidewall and the second lower sidewall, during inserting an electronic device, for example, an electrical connector or the like, into the device receiving space 1 of the housing or during other operations, the first lower sidewall provides a support for the second lower sidewall, preventing the second lower sidewall from being deformed, keeping the shape of the housing near the port thereof, and increasing the strength of the housing. For example, it may prevent the port of the housing from being cracked or dislocated, ensuring the size of the port of the housing.

Those of ordinary skill in the art would appreciate the above embodiments are intended to be exemplary, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "an embodiment" of the present invention are not intended to be interpreted as excluding the existence of additional embodiments that also incorporate the recited features. Moreover, unless explicitly stated to the contrary, embodiments "comprising" or "having" or "including" an element or a plurality of elements having a particular property may include additional such elements not having that property.

What is claimed is:

1. An insulating housing, comprising:
    an upper housing;
    two upper sidewalls positioned on opposite edges of the upper housing;
    a lower housing connected to the upper housing;
    two lower sidewalls positioned on opposite edges of the lower housing, each of the lower sidewalls being connected with one of the upper sidewalls, and each of the lower sidewalls having
        a first lower sidewall, and
        a second lower sidewall independent from the first lower sidewall, being positioned proximate to a device receiving end of the insulating housing, an inner surface of the first lower sidewall extending toward and abutting against an outer surface of the second lower sidewall; and
    a device receiving space positioned between the upper housing and the lower housing for receiving an electronic device.

2. The insulating housing according to claim 1, further comprising two opposite housing sidewalls, each housing sidewall including one of the two upper sidewalls and one of the two lower sidewalls.

3. The insulating housing according to claim 1, further comprising a bent transition portion positioned between the lower housing and each first lower sidewall.

4. The insulating housing according to claim 3, wherein the bent transition portion is connected continuously to the lower housing and the first lower sidewall, protruding outward therefrom.

5. The insulating housing according to claim 1, wherein each upper sidewall includes:
    a first upper sidewall having an outer surface that abuts against the inner surface of one first lower sidewall; and
    a second upper sidewall integrally extending from the first upper sidewall towards the device receiving end of the insulating housing.

6. The insulating housing according to claim 5, wherein a plurality of pins are positioned on the first upper sidewall.

7. The insulating housing according to claim 6, wherein the pins pass through the lower housing at an inner side of the first lower sidewall and protrude out of the lower housing.

8. The insulating housing according to claim 5, wherein the second lower sidewall and the second upper sidewall are connected together by a complementary connecting mechanism.

9. The insulating housing according to claim 8, wherein the complementary connecting mechanism includes:
    a dovetail groove disposed on the second upper sidewall or second lower sidewall; and
    a complementary dovetail protrusion positioned on the other of the second lower sidewall or second upper sidewall.

10. The insulating housing according to claim 5, wherein a projection receiving opening is disposed on the first upper sidewall or the first lower sidewall.

11. The insulating housing according to claim 10, wherein a locking projection complimentary to the projection receiving opening is positioned on the other of the first upper sidewall and the first lower sidewall.

12. The insulating housing according to claim 11, wherein when the upper housing is connected to the lower housing, the locking projection is engaged with the projection receiving opening.

* * * * *